United States Patent [19]
Luning et al.

[11] Patent Number: 6,117,719
[45] Date of Patent: Sep. 12, 2000

[54] OXIDE SPACERS AS SOLID SOURCES FOR GALLIUM DOPANT INTRODUCTION

[75] Inventors: Scott Luning, San Francisco; Emi Ishida, Sunnyvale, both of Calif.

[73] Assignee: Advanced Micro Devices, Inc., Sunnyvale, Calif.

[21] Appl. No.: 08/993,060

[22] Filed: Dec. 18, 1997

[51] Int. Cl.[7] .............................................. H01L 21/8238
[52] U.S. Cl. .......................... 438/230; 438/143; 438/303; 438/367; 438/542; 438/373; 438/548; 438/564
[58] Field of Search ..................... 438/143, 230, 438/231, 303, 304, 305, 367, 373, 434, 542, 547, 564, 548

[56] References Cited

U.S. PATENT DOCUMENTS

| | | | |
|---|---|---|---|
| 3,943,016 | 3/1976 | Marcotte | 438/547 |
| 4,666,557 | 5/1987 | Collins et al. | 438/434 |
| 4,691,435 | 9/1987 | Anantha et al. | 438/564 |
| 4,728,617 | 3/1988 | Woo et al. | 438/305 |
| 4,755,479 | 7/1988 | Miura | 438/303 |
| 4,757,026 | 7/1988 | Woo et al. | 438/231 |
| 4,780,426 | 10/1988 | Koshino et al. | 438/373 |
| 4,784,965 | 11/1988 | Woo et al. | 438/303 |
| 4,908,326 | 3/1990 | Ma et al. | 438/305 |
| 4,916,083 | 4/1990 | Monkowski et al. | 438/367 |
| 5,234,852 | 8/1993 | Liou | 438/303 |
| 5,501,997 | 3/1996 | Lin et al. | 438/303 |
| 5,599,734 | 2/1997 | Byun et al. | 438/143 |
| 5,710,054 | 1/1998 | Gardner et al. | 438/304 |
| 5,756,383 | 5/1998 | Gardner | 438/231 |
| 5,759,885 | 6/1998 | Son | 438/230 |
| 5,814,545 | 9/1998 | Seddon et al. | 438/303 |
| 5,821,147 | 10/1998 | Kizilyalli | 438/305 |

*Primary Examiner*—Carl Whitehead, Jr.
*Assistant Examiner*—Khanh Duong

[57] ABSTRACT

Impurities are formed in the active region of a semiconductor substrate by diffusion from a gate electrode sidewall spacer. A gate electrode is formed on a semiconductor substrate with a gate dielectric layer therebetween. Sidewall spacers are formed on the side surfaces of the gate electrode. Dopant atoms are subsequently introduce to transform the spacers into solid dopant sources. Dopant atoms are diffused from the spacers into the semiconductor substrate to form first doped regions.

23 Claims, 2 Drawing Sheets

OXIDE SPACERS AS SOLID SOURCES FOR GALLIUM DOPANT INTRODUCTION

FIELD OF THE INVENTION

The present invention relates to the manufacture of semiconductor devices, particularly to the introduction of dopant into shallow regions surrounding the gate.

BACKGROUND OF THE INVENTION

Metal-oxide-semiconductor field-effect transistors (MOSFET) are widely used semiconductor devices. The escalating need for increased densification and performance in ultra-large scale integration semiconductor devices requires reduced sized MOSFETs.

The structure of a typical MOSFET is shown in FIG. 1. Referring to FIG. 1, the structure shown comprises a semiconductor substrate 10 having an active region isolated by surrounding field oxide region 1. The active region comprises source/drain regions 12 and 13, and gate electrode 14 spaced apart from semiconductor substrate 10 by gate dielectric layer 15. Source drain regions 12 and 13 are characterized by shallow sub-regions 17A and deep sub-regions 17B. Deep sub-regions 17B and shallow sub-regions 17A may or may not have substantially the same dopant concentrations. Sidewall spacers 16 are formed on the side surfaces of gate electrode 14. The channel region between shallow sub-regions 17A is designated by reference numeral 19.

In a conventional method for forming a MOSFET structure shown in FIG. 1, two ion implantation steps are performed. One ion implantation is performed before formation of the sidewall spacers 16 to form shallow sub-region 17A and another is performed after formation of the sidewall spacers to form deep sub-region 17B. During the ion implantation to form the deep sub-regions 17B, the sidewall spacers 16 shield the underlying semiconductor substrate, thereby limiting dopant penetration into shallow subregion 17A.

As the size of a MOSFET structure shrinks into the sub-micron range, the depth of the shallow regions falls into the ultra-shallow range, (i.e. below 0.1 micron). Producing shallow subregions that fall into the ultra-shallow range through conventional implantation is problematic.

Producing shallow subregions of ultra-shallow depth using ion implantation requires low energy implantation. Low energy implantation typically uses energy levels below 10 keV.

Much of the implantation equipment found in semiconductor manufacturing facilities does not operate at these low energy levels. While implantation equipment capable of generating low energy ion beams is available, the equipment may have to be purchased. Obviously, purchasing additional equipment drives up the cost of manufacturing. Additionally, this equipment tends to be relatively inefficient compared to higher energy implantation equipment, thus further raising the cost of manufacturing.

Furthermore, forming shallow subregions using low energy level implantation has several problems. As one skilled in the art is aware, implantation is usually followed by activation annealing at some point in the production of MOSFETs. As a result of crystalline defects, such as those induced by ion implantation, implanted impurities rapidly diffuse, through a process known as transient enhanced diffusion, during activation annealing thereby expanding the extent of the doped region. This expansion renders it extremely difficult to achieve shallow junction regions.

Naturally forming surface films, such as native oxides, that form on the surfaces of the area to be implanted are especially troublesome to low energy level implantation. Typically, naturally forming surface films are so thin that they have a negligible affect on implantation. However, as the targeted junction depths become shallower and the implantation energies become lower, variations in the thickness of naturally forming surface films become very significant. At the low energies necessary to create shallow sub-regions by implantation, variations in the native oxide layers adversely affect the quality of shallow regions that can be formed through low energy implantation.

There exists a need to provide a method for forming shallow subregions that avoids the cost attendant upon implantation equipment capable of low energy level implantation. There also exists a need to provide a method that can be used to form ultra shallow regions that avoids problems attendant to implantation at low energies, e.g., transient enhanced diffusion and variation in the thickness of naturally forming surface film.

SUMMARY OF THE INVENTION

An object of the present invention is a method for forming a semiconductor device having shallow regions of a desired electrical activity type. It is another object of the present invention to form a shallow subregion within or near a source/drain region.

Additional objects, advantages and other features of the present invention will be set forth in part in the description which follows and will in part become apparent to those having ordinary skill in the art upon examination of the following, or may be learned from practice of the present invention. The objects and advantages of the invention may be realized and obtained as particularly pointed out in the present invention.

According to the present invention the foregoing and other objectives are achieved in part by a method for forming a semiconductor device. According to one aspect of the present invention, a gate electrode is formed on a semiconductor substrate with a gate dielectric layer therebetween. On the side surfaces of the gate electrode sidewall spacers are formed. Dopant atoms are subsequently introduced to enable the spacers to serve as solid dopant sources. Dopant atoms are diffused from the spacers into the semiconductor substrate to form first doped regions.

According to another aspect of the invention, a second doped region, deeper than the first doped regions, is formed. The second doped region may be formed during solid source implantation. Alternatively, another ion implantation may be performed to form the second doped regions. To reduce the level of dopant atom penetration into the gate electrode during implantation, a layer may be formed on the upper surface of the gate electrode. The first doped region extends substantially under the sidewall spacers. The dopant may comprise gallium, and the sidewall spacers may comprise an oxide. The dopant concentration of the first doped region may be the same, less, or greater than the dopant concentration of the second doped region.

According to another aspect of the invention, the first doped region may comprise a lightly doped region of a source/drain region, and the second doped region may comprise a heavily doped region of a source/drain region. A channel between the first doped regions is less than 1 micron in length. The junction depth of the first doped region is about 0.1 to about 0.01 microns.

According to another aspect of the invention, halo regions in the channel of a n-channel MOSFET device are formed.

The halo regions are formed at the edges of the channel and have a higher dopant concentration than the interior of the channel.

Additional objects and advantages of the present invention will become readily apparent to those skilled in this art from the following detailed description, simply by way of illustration of the best mode contemplated for carrying out the invention. As will be realized, the invention is capable of other and different embodiments, and its several details are capable of modifications in various obvious respects, all without departing from the present invention. Accordingly, the drawings and descriptions are to be regarded as illustrative in nature, and not as restrictive.

BRIEF DESCRIPTION OF THE DRAWINGS

The present invention is illustrated by way of example, and not by way of limitation, in the figures of the accompanying drawings showing elements not drawn to scale and in which like reference numerals refer to similar elements and in which.

DETAILED DESCRIPTION OF THE PREFERRED EMBODIMENT

The present invention comprises an efficient, cost effective method for forming shallow regions of a desired electrical activity type (e.g. p-type, n-type) in a semiconductor substrate, such as a shallow subregion within a source/drain region near the gate electrode of a MOSFET. In accordance with an embodiment of the present invention, a sidewall spacer is formed on and along the side surfaces of a gate electrode. Next, dopant atoms are introduced into the material comprising the sidewall spacers, by, for example, performing ion implantation. During dopant introduction, dopant atoms are implanted into the sidewall spacer transforming the sidewall spacer into a solid source of the dopant. A solid dopant source, as referred to herein, is a solid material that serves as a diffusion source of a dopant for diffusion into another material. Heat is then applied to the solid dopant source, i.e., the doped sidewall spacer, employing conventional heating means, causing the dopant to diffuse from the sidewall spacer into the region of the semiconductor substrate below the sidewall spacer to form a shallow doped subregion.

Figure 1:
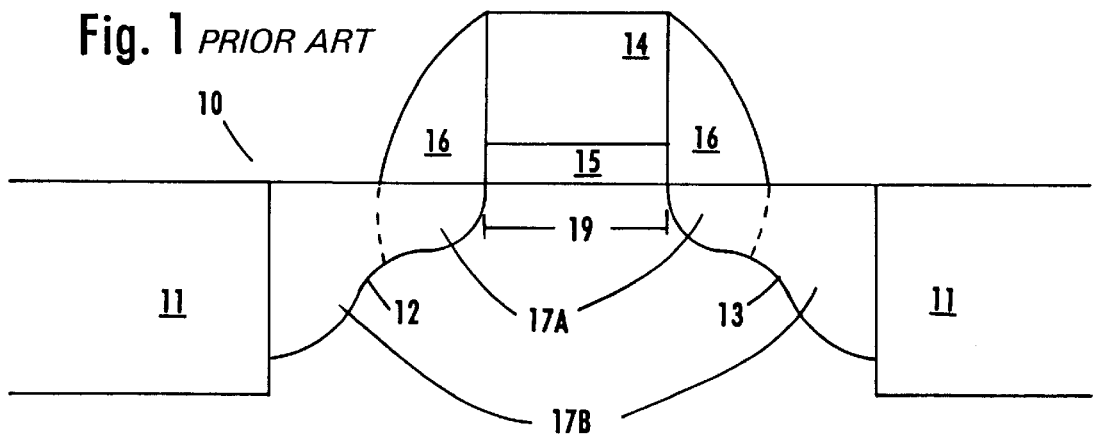
FIG. 1 schematically illustrates a conventional MOSFET device.
Figure 2:
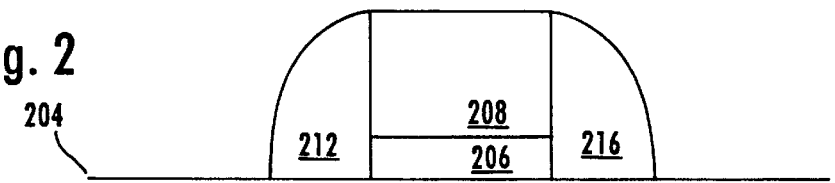
FIGS. 2 through 4 schematically illustrates the sequential steps for forming a shallow region using a sidewall spacer serving as a solid dopant source for diffusion.
Figure 3:
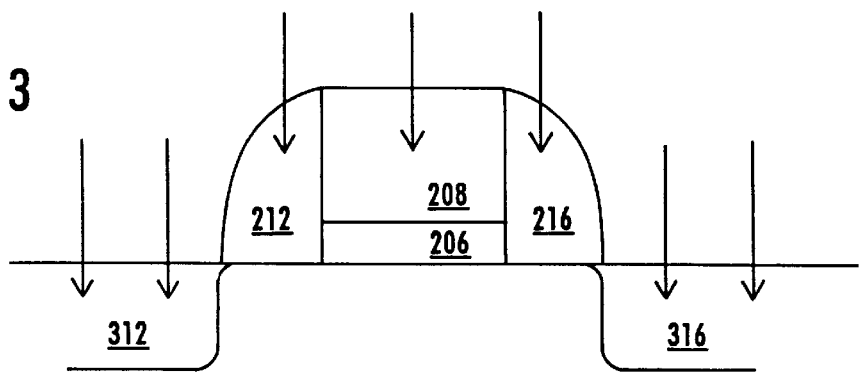
Figure 4:
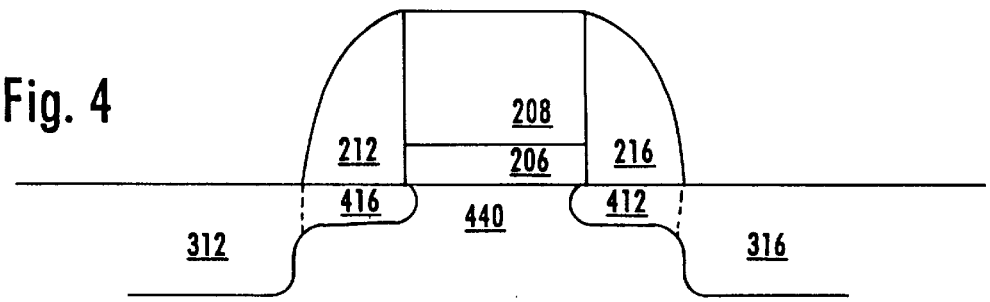

An embodiment of the present invention is illustrated in FIGS. 2 through 4. As shown in FIG. 2, gate electrode 208 is formed on semiconductor substrate 204 with gate dielectric layer 206 therebetween. Gate electrode 208 typically comprises doped polycrystalline silicon and the gate dielectric layer typically comprises silicon oxide. Gate electrode 208, gate dielectric layer 206, are formed using conventional deposition, photolithographic and etching techniques.

Next, sidewall spacer 212 and sidewall spacer 216 are formed on the side surfaces of gate electrode 208 and gate dielectric 206. Sidewall spacer 212 and sidewall spacer 216 are comprised of an insulating material, such as an oxide, referred to herein as a sidewall insulating material. Sidewall spacer 212 and sidewall spacer 216 are formed using conventional deposition, photolithographic and etching techniques. For example, sidewall spacer 212 and sidewall spacer 216 may be formed by depositing a conformal layer (e.g. blanket deposition) comprising the sidewall insulating material over the surfaces of gate electrode 208 and substrate 204, followed by an anisotropic etching to form the sidewall spacers.

Next, as shown in FIG. 3, dopant atoms are introduced into the insulating sidewall material. In one embodiment of the present invention, dopant atoms are introduced by performing ion implantation after the sidewall spacers 212 and 216 are formed. During ion implantation, sidewall spacers 212 and 216 are doped and deep sub-regions 312 and 316 are formed. The ion implantation may be performed at energies higher than those used in low energy implantation.

While one technique for introducing dopant atoms into the sidewall insulating material has been described, other alternatives are possible. For example, after depositing the conformal layer comprising the sidewall insulating material, dopant is introduced into the sidewall insulating material through in situ doping. Next, the sidewall spacers are formed by performing anisotropic etching. Other alternatives involve laser and plasma assisted doping, which may also be performed before or after the sidewall spacers are formed. Therefore, it is understood that the present invention is not limited to any particular technique, or particular order, for introducing dopant atoms into the sidewall insulating material.

The dopant introduced into the sidewall insulating material is selected in combination with the sidewall insulating material used to form the sidewall spacers. The dopant selected is mobile in the sidewall insulating material selected for forming the sidewall spacers. In the context of the present invention, a dopant is mobile if it has sufficient diffusivity to diffuse from the selected sidewall insulating material to form doped regions of a desired depth and concentration in the underlying substrate. Given the objectives of the present invention, one skilled in the art can easily select appropriate sidewall insulating materials and dopants. For example, it was found that gallium is mobile in oxide sidewall spacers. Ion implantation into a solid material at least in part for providing a mobile dopant for subsequent out diffusion, is referred to as a solid source implantation.

Next, as shown in FIG. 4, the doped sidewall spacers are heated to a suitable temperature to diffuse the dopant into the underlying substrate forming shallow regions 412 and 416. As one having ordinary skill in the art would understand, shallow regions 412 and 314 and deep regions 312 and 314 can ultimately form active source/drains regions of the MOSFET.

The dopant may be diffused to a depth so that the junction depth of the shallow region is in the ultra-shallow range (about 0.1 to about 0.01 microns) and the length of the channel region is less than about 1 micron after any subsequent processing. Subsequent processing may be conducted to complete the manufacture of the MOSFET, possibly including activation annealing to activate the source/drain regions. On the other hand, annealing occurring during the out-diffusion of the dopant may be sufficient to activate the source/drain regions.

The source/drain regions may, for example, comprise a lightly doped (LDD) shallow subregion and a moderately doped (MDD) or a heavily doped (HDD) subregion.

Alternatively, the dopant concentration of the shallow subregions may be substantially identical to the dopant concentration of the deep subregions.

As used throughout the present disclosure, LDD denotes a conventional lightly doped source/drain implant or region, typically having an impurity concentration of about $2\times10^{18}$ to about $5\times10^{18}$ atoms/cm$^3$. As used throughout the present disclosure, the expression MDD denotes a conventional moderately doped source/drain implant or region, typically having an impurity concentration of about $5\times10^{18}$ to about $2\times10^{19}$ atoms/cm$^3$. As also used throughout this disclosure, HDD denotes a conventional heavily doped source/drain implant or 20 region, typically having an impurity concentration of about $2\times10^{19}$ atoms/cm$^3$ to about $2\times10^{20}$ atoms/cm$^3$.

While various specific ranges of dopant concentrations of implants and regions are described, other dopant concentrations are possible. Therefore, it is understood that the present invention is not limited to forming implants or regions having any particular dopant concentration. In particular, the present invention in not limited to forming, through the use of sidewall spacers as solid dopant sources, shallow regions of any particular dopant concentration.

Given the objectives of the present invention, one having ordinary skill in the art can easily optimize the dose and energy levels of solid source implantation and the diffusion and heating time/temperature cycle to form a shallow region with the desired depth and concentration in a particular situation. For example, forming a shallow region with gallium as the dopant having a desired depth of about 100 angstroms to about 1000 angstroms may be achieved by first performing solid source implantation at a dosage of about $10^{14}$ atoms/cm$^2$ to about $10^{15}$ atoms/cm$^2$ at an energy level of about 10 keV to about 100 keV to form the requisite dopant concentration in the sidewall spacers. Then diffusion and heating is performed at a temperature of about 950 C° for period of time of 5 minutes to 1 hour to diffuse the dopant to the desired depth. As an alternative to the diffusion and heating described immediately above, rapid thermal annealing (RTA) may be performed at temperature of about 1050 C° for a period of 5 seconds to 2 minutes.

After diffusion, further ion implantation may be performed. During solid source implantation deep sub-regions 312 and 316 are formed, because these regions are not masked by sidewall spacers 212 and 216, respectively. In situations wherein the deep sub-regions formed are not of the desired depth or dopant concentration, further implantation steps may be performed to achieve deep sub-regions having the desired characteristics.

As those skilled in the art would recognize, to form active source/drain regions from shallow regions and deep regions after implantation, activation annealing may be performed, which may undesirably expand the shallow subregions and increase their junction depth. To avoid such adverse consequences, rather than performing the solid source implantation before the implantation of a non-mobile dopant, implantation of the non-mobile dopant can be first performed, followed by activation annealing. Subsequently, solid source implantation and diffusion to form the shallow sub-regions is performed.

Referring to FIG. 4, those skilled in the art will also recognize that during solid source implantation it is possible for the mobile dopant implanted in the gate electrode 208 to penetrate the gate dielectric layer 206 into the channel region 440. To prevent this penetration, the time/temperature cycle for diffusion can be selected so that the diffusion that occurs is sufficient to form shallow regions with the desired characteristics but insufficient to cause the dopant to penetrate the insulating layer 206. Given this objective, those skilled in the art can determine a suitable time/temperature cycle.

Figure 5:
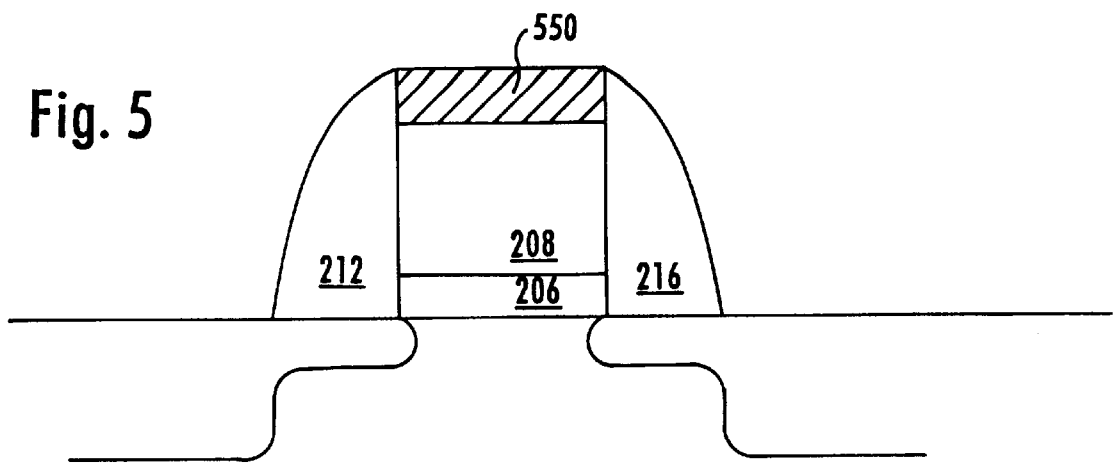
FIG. 5 schematically illustrates the step of forming a protective insulating layer to shield a gate electrode during solid source implantation.

In another embodiment of the present invention, the penetration of the mobile dopant into the gate dielectric layer is prevented by forming a protective layer on the upper surface of the gate electrode. For example, as shown in FIG. 5, a protective insulating layer 550 is formed on gate electrode 208. Insulating layer 550 comprises a material capable of shielding at least in part, the gate electrode 208 against the penetration of mobile dopant atoms during solid source implantation. For example, a protective insulating layer of a nitride, such as silicon nitride, of a suitable thickness would shield the gate electrode 208, thus reducing the penetration of gallium.

The present invention involves the use of conventional equipment, deposition, photolithographic and etching techniques, and conventional materials. The impurity implantations are conducted using conventional equipment and conventional parameters to achieve conventional dopant concentrations in the deep sub-regions. According to an embodiment of the present invention, shallow sub-regions are advantageously formed using conventional implantation techniques at energies higher than low energy implantation.

It is often desirable to create channels that have a higher concentration of dopant at the edges of the channel near the side surfaces of the gate electrode. A dopant of the same electrical activity type as that of the channel (e.g. n-type, p-type) is used to form the higher doping concentrations at the edges of channel region. Such regions are referred to as halo regions. For example, referring to FIG. 7, halo region 712 and halo region 714 have a higher concentration of a dopant of the same electrical activity type than inner portion 724 of channel 620.

Figure 6:
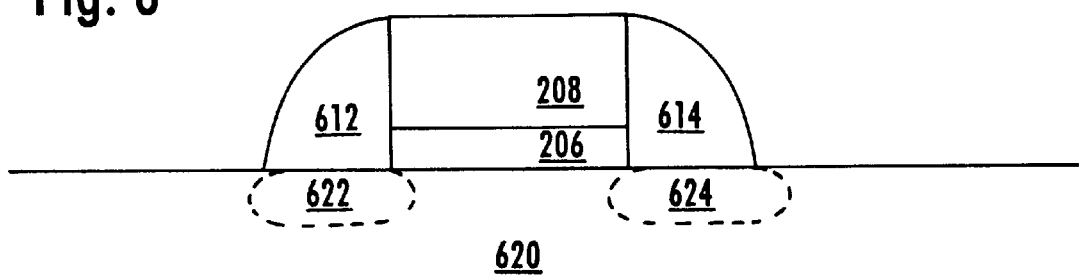
FIGS. 6 and 7 schematically illustrate the step of forming halo regions using a sidewall spacer serving as a solid dopant source.

Referring to FIG. 6, in another embodiment of the present invention, halo regions are formed by first forming sidewall spacers as described above, then performing solid source implantation to transform the sidewall spacers into solid dopant sources used to form doped area 622 and doped area 624 by subsequent diffusion and heating.

Figure 7:
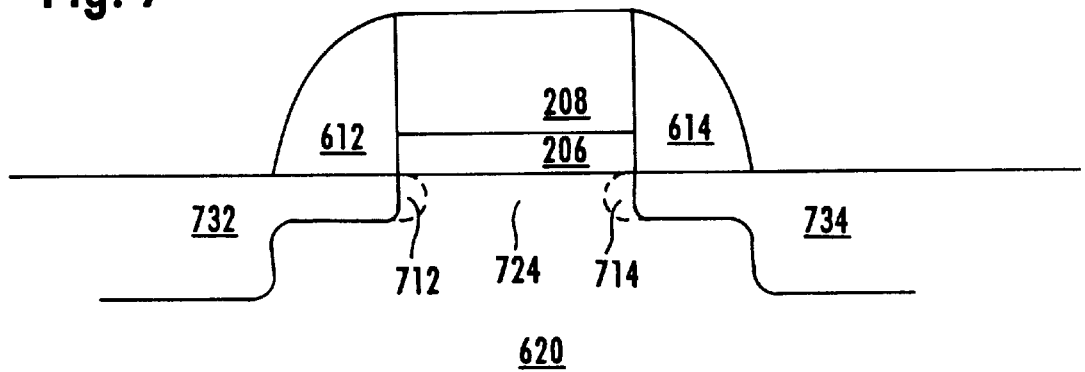

Adverting to FIG. 7, source/drain regions 732 and 734 are then formed using conventional methods. Formation of the source/drain regions 732 and 734 leaves halo region 712 and halo region 714 extending beyond the junctions of the source/drain regions 732 and 734. As mentioned previously, halo region 712 and halo region 714 are formed to have a higher concentration of a dopant that is used to form regions of the same electrical activity type as that of the channel 620. Given this objective, those skilled in the art can easily determine the dose and energy levels of solid source implantation and the time/temperature cycle for diffusion and heating necessary to form doped area 712 and doped area 714 so that doped area 712 and doped area 714 have the depth and concentration needed to form halo regions of the desired depth and concentration after any subsequent processing, including the activation of the source/drain regions.

For example, gallium is a p-type dopant that, as previously mentioned, is mobile in oxide sidewall spacers. To form halo regions in a p-type channel having a desired depth of 100 angstroms to 1000 angstroms (i.e. about the same or a little deeper than the depth of shallow subregions), oxide sidewall spacers are first formed. Then, solid source implantation is performed at a dosage of about $10^{13}$ atoms/cm$^2$ to about $10^{14}$ atoms/cm$^2$ at an energy level of about 10 keV to about 100 keV to form the requisite dopant concentration in the sidewall spacers. Then diffusion and heating is performed at a temperature of about 950 C° for period of time of 5 minutes to 1 hour to diffuse the dopant to the desired depth necessary to form the halo regions. Alternatively, RTA may be performed at temperature of about 1050 C° for a period of 5 seconds to 2 minutes. After diffusion and heating or RTA, the n-type source/drain regions are formed leaving halo regions at the edges of the channel near the side surface of the gate electrode with a higher concentration of p-type dopant than the inner portion of the channel.

It should be noted that it is not necessary to form n-type source/drain regions after forming the halo regions. Instead, the formation of the sidewall spacers that serve as solid dopant sources for diffusing dopant into the halo regions, and the subsequent diffusing and heating that diffuses the dopant into the halo regions, may be performed after forming the n-type source/drain regions.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of manufacturing a semiconductor device, comprising:

forming a gate electrode, having an upper surface and side surfaces, on a surface of a semiconductor substrate with a gate dielectric layer therebetween;

forming sidewall spacers comprising a sidewall insulating material that is substantially undoped, on the side surfaces of the gate electrode;

introducing dopant atoms into said sidewalls spacers comprising said sidewall insulating material; and diffusing said dopant atoms introduced into said sidewall spacers from said sidewall spacers into regions of the underlying semiconductor substrate to form first doped regions extending to a first depth therein.

2. The method of claim 1, wherein:

the dopant comprises gallium; and the sidewall insulating material comprises an oxide.

3. The method of claim 2, wherein the first doped regions extend under the sidewall spacers.

4. The method of claim 1, wherein the step of forming sidewall spacers and the step of introducing dopant atoms includes:

depositing a conformal layer comprised of said sidewall insulating material;

conducting anisotropic etching to form said sidewall spacers; and after performing the step of conducting anisotropic etching, then introducing dopant atoms into said sidewall spacers.

5. The method of claim 1, wherein the step of introducing dopant atoms includes conducting a first implantation of dopant atoms into said sidewall insulating material.

6. The method of claim 5, further comprising conducting the first implantation of dopant atoms to form second doped regions adjacent the first doped regions, extending below the surfaces of the semiconductor substrate to a second depth greater than the first depth.

7. The method of claim 6, wherein the dopant concentration of the first doped regions and the dopant concentration of the second doped regions, are the same.

8. The method of claim 6, wherein the dopant concentration of the first doped regions is less then the dopant concentration of the second doped regions.

9. The method of claim 6, wherein the dopant concentration of the first doped regions is greater then the dopant concentration of the second doped regions.

10. The method of claim 6, wherein the first doped regions constitute lightly doped portions of source/drain regions.

11. The method of claim 6, wherein the second doped regions constitute heavily doped regions of source/drain regions.

12. The method of claim 5, further comprising forming an insulating layer on the upper surface of the gate electrode to reduce implantation of dopant atoms into the gate electrode.

13. The method of claim 1, wherein:

the semiconductor device comprises a channel having an electrical activity type, outer edges adjacent to said first doped regions, an interior portion between said outer edges, and substantially extending under the gate electrode; and the step of diffusing said dopant atoms from the sidewall spacers includes diffusing dopant atoms of the same electrical activity type as that of the channel.

14. The method of claim 2, wherein the semiconductor device comprises an N-channel MOSFET, said method further comprising diffusing the dopant atoms to form a halo region in the channel of an N-channel MOSFET, the channel having outer edges adjacent to said first doped regions, an interior portion between said outer edges, and extending under the gate electrode, the halo region being formed adjacent to the outer edges and having a higher dopant concentration than said interior portion.

15. The method of claim 2, wherein a channel region extending under the gate electrode is about one micron or less.

16. The method of claim 3, wherein the first doped regions comprise an activate source/drain region, and the first depth of the first doped regions is about 0.15 to about 0.01 microns.

17. The method of claim 5, further comprising conducting a second implantation to form second doped regions, the second doped regions having a depth greater than said first depth.

18. The method of claim 5, further comprising conducting the first implantation of dopant atoms at a dosage of about $10^{14}$ atoms/cm$^2$ to about $10^{15}$ atoms/cm$^2$.

19. The method of claim 18, further comprising conducting the first implantation at an energy level of about 10 keV to about 100 keV.

20. The method of claim 18, further comprising diffusing said dopant atoms from the sidewall spacers by heating for about five minutes to about one hour.

21. The method of claim 20, further comprising diffusing said dopant atoms from the sidewall spacers by heating at a temperature of about 950 C°.

22. The method of claim 18, further comprising diffusing said dopant atoms from the sidewall spacers by rapid thermal annealing for about five seconds to about two minutes.

23. The method of claim 18, further comprising rapid thermal annealing at a temperature of about 1050 C°.

* * * * *